(12) United States Patent
Osawa

(10) Patent No.: US 12,306,233 B2
(45) Date of Patent: May 20, 2025

(54) LIGHT SENSOR PROBE

(71) Applicant: SEIKOH GIKEN Co., Ltd., Matsudo (JP)

(72) Inventor: Ryuji Osawa, Matsudo (JP)

(73) Assignee: SEIKOH GIKEN Co., Ltd., Matsudo (JP)

( * ) Notice: Subject to any disclaimer, the term of this patent is extended or adjusted under 35 U.S.C. 154(b) by 147 days.

(21) Appl. No.: 18/341,762

(22) Filed: Jun. 27, 2023

(65) Prior Publication Data
US 2024/0019473 A1    Jan. 18, 2024

(30) Foreign Application Priority Data

Jul. 12, 2022    (JP) ................................. 2022-111598

(51) Int. Cl.
     *G01R 29/08*      (2006.01)

(52) U.S. Cl.
     CPC ................ *G01R 29/0885* (2013.01)

(58) Field of Classification Search
     CPC .................................................. G01R 29/0885
     USPC .......................................................... 324/96
     See application file for complete search history.

(56) References Cited

U.S. PATENT DOCUMENTS

| | | | | |
|---|---|---|---|---|
| RE46,932 E * | 7/2018 | Sugiyama | ............. | G02F 1/0305 |
| 2004/0041083 A1 * | 3/2004 | Kadogawa | ........... | G01R 15/241 |
| | | | | 250/214 R |
| 2004/0196037 A1 * | 10/2004 | Xiang | .................... | G01N 24/10 |
| | | | | 324/300 |
| 2005/0254743 A1 * | 11/2005 | Akiyama | ............... | H04B 10/58 |
| | | | | 385/3 |
| 2013/0045008 A1 * | 2/2013 | Miyazaki | ........... | G01R 29/0885 |
| | | | | 398/38 |
| 2018/0238949 A1 * | 8/2018 | Shinagawa | ........... | H01S 3/0064 |
| 2022/0050132 A1 * | 2/2022 | Matsumoto | .......... | G01R 35/005 |
| 2022/0291260 A1 | 9/2022 | Osawa et al. | | |

FOREIGN PATENT DOCUMENTS

| | | |
|---|---|---|
| JP | 2020-008537 A | 1/2020 |
| JP | 6813763 B | 1/2021 |
| JP | 2021-110647 A | 8/2021 |
| WO | WO-2010062627 A2 * | 6/2010 ........... G01N 21/255 |

* cited by examiner

*Primary Examiner* — Christopher P McAndrew
(74) *Attorney, Agent, or Firm* — Yokoi & Co., U.S.A.; Toshiyuki Yokoi

(57) ABSTRACT

A light sensor probe includes an optical sensor unit configured to modulate an incident light depending on an intensity of an electric field of a place on which the optical sensor unit is located and output the modulated light. The optical sensor unit includes an optical modulator having a modulation electrode integrally formed with antennas. The optical modulator is a branch interference type optical modulator and a reflection type optical modulator. An input optical fiber and an output optical fiber are formed by one input/output optical fiber. A package is formed by a metal plate which functions as a shielding layer to the electric field. An opening is provided on a tip surface at a position capable of being approached to a measurement place. An insulating layer is provided on an outermost surface of a circumference of the opening.

8 Claims, 8 Drawing Sheets

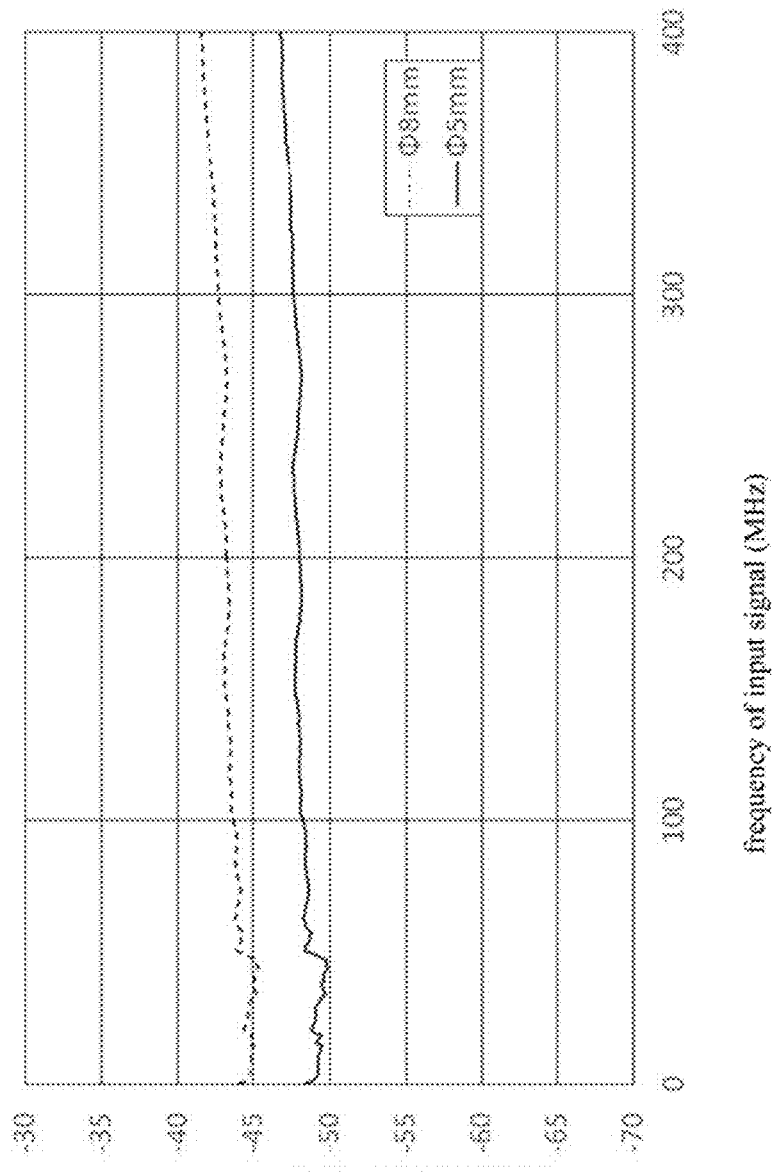

LIGHT SENSOR PROBE

CROSS-REFERENCE TO RELATED APPLICATIONS

This patent specification is based on Japanese patent application, No. 2022-111598 filed on Jul. 12, 2022 in the Japan Patent Office, the entire contents of which are incorporated by reference herein.

PRIOR ART

[Patent document 1] Japanese Patent No. 6813763
[Patent document 2] Japanese Unexamined Patent Application Publication No. 2020-8537
[Patent document 3] Japanese Unexamined Patent Application Publication No. 2021-110647

BACKGROUND OF THE INVENTION

The present invention relates to a light sensor probe for converting an intensity change of an electric field or a magnetic field generated at a measurement place into an optical signal by an optical sensor unit and outputting the optical signal through an output optical fiber.

In recent years, various control devices using a high speed CPU or the like have been developed and resistance tests such as an immunity test called IEC-61000-4 is performed for intentionally radiating an electromagnetic field or injecting a noise voltage on an electronic circuit alone or on a whole product as a tested body for preventing malfunction. In the above describe tests, test environment levels of the electromagnetic field or the voltage for performing the test are defined by the standard and acceptance/rejection is determined by the existence of malfunction. However, in order to solve the malfunction, it is required to identify an occurrence part of the noise and detecting a waveform of the noise causing the malfunction generated in the circuit in the above described test and correctly measuring input/output signals of the electric component installed on an electric circuit board and electric signals transferred through the wirings.

As for a general method for measuring the electric signal of the electric components and the wirings, the electric signal of the measurement point is transferred to a measuring instrument such as an oscilloscope by using an electric probe having contact terminals and a voltage waveform or the like of the transferred electric signal is measured. However, when a ground level of the measurement point is different from that of the measuring instrument or when the voltage signal between ungrounded two points is measured, it is difficult to measure the voltage waveform correctly because of the influence of the mixture of signals from the ground and the capacity of the electric probe, for example. In particular, the above described influence of the ground and the capacity is large in a high frequency region. Furthermore, an input impedance and an output impedance are not 50Ω in many integrated circuits such as IC and LSI. Therefore, when the input noise voltage is measured by using the electric probe having a low input impedance, current flows to the electric probe side and the noise voltage to be measured is lowered by the load effect of the proving.

As for the means for solving the above described problem, a measuring instrument using an optical voltage prove has been developed where the voltage signal is converted into an optical signal and the optical signal is transferred to the measuring instrument through an optical fiber. In the above described method, a capacity component of the prove is extremely low. Thus, the input impedance is extremely high and the measurement point and the measuring instrument are electrically separated from each other completely. The optical voltage prove can measure even high frequency component. Thus, the influence of the ground can be eliminated and the intrusion of the electric signal noise generated midway can be prevented. Examples of the above described conventional optical voltage prove are described in Patent documents 1 and 2. These are the optical voltage prove using a waveguide type optical modulator wherein a voltage signal of the contact terminals is applied between two modulation electrodes of a branch interference type optical modulator formed on a lithium niobate crystal substrate to obtain an optical intensity modulation signal.

On the other hand, although an electromagnetic wave noise can be detected by general antennas, in order to eliminate the influence of the electric cables in the middle of a way to the measuring device, an optoelectrical field sensor probe is developed for connecting an antenna pad to the electrodes of the optical modulator or the like used for the optical voltage prove and outputting an electromagnetic wave noise signal by an optical signal. An example of the above described optical magnetic field sensor probe is described in Patent document 3.

SUMMARY OF THE INVENTION

High voltage circuits are frequently used with the development of electrification of vehicles and the demands for measuring signals and detecting electromagnetic noise in the high voltage circuits are increasing. When the above described high voltage signals are measured, there is an influence on the normal operation of the circuit by the contact of probe terminals even when the optical voltage prove is used in addition to the case of using the conventional electric probe. In such a case, a difficulty arises for measuring the signals in the normal operation.

Furthermore, the measurement has been attempted by using a normal small antenna or an optoelectrical field sensor probe for identifying the occurrence part of the electromagnetic wave noise and measuring the waveform of the noise. However, since the receiving range is wide with respect to the propagation direction of the electromagnetic wave, test environment electromagnetic field is simultaneously received and the generated noise signal is buried in the test environment electromagnetic field. Thus, it is difficult to detect the occurrence part of the electromagnetic wave noise signal and the noise signal itself with sufficient accuracy.

As described above, the conventional light sensor probes such as the optical voltage prove and the optoelectrical field sensor probe are not enough for the purpose of measuring the high voltage signals, identifying the occurrence part of the electromagnetic noise and measuring the waveform of the noise.

The present invention provides a light sensor probe capable of measuring the high voltage signals, identifying the occurrence part of the electromagnetic noise and measuring the waveform of the noise without contact with a measurement place.

The first viewpoint of the light sensor probe of the present invention includes: an optical sensor unit configured to modulate an incident light depending on an intensity of an electric field or a magnetic field of a place on which the optical sensor unit is located and output the modulated light; an input optical fiber that is connected with the optical sensor unit; an output optical fiber that is connected with the optical sensor unit; and a package that houses the optical sensor unit, a part of the input optical fiber and a part of the output optical fiber, wherein an intensity change of the electric field or the magnetic field generated at a measurement place is converted into an optical signal by the optical sensor unit and the optical signal is outputted through the output optical fiber, the package has a shielding layer formed of a material having a shielding effect for shielding the electric field or the magnetic field at least in a part of the package, and the shielding layer has an opening at a position capable of facing the measurement place so that the opening can be approached to the measurement place.

As described above, the light sensor probe of the present invention is provided with an optical sensor unit configured to modulate an incident light depending on an intensity of an electric field or a magnetic field of a place on which the optical sensor unit is located and output the modulated light. Here, the optical sensor unit configured to modulate the incident light depending on the intensity of the electric field can be formed by connecting the antenna pad to the electrodes of the optical modulator using an electrooptic effect similar to the conventional optoelectrical field sensor, for example. It is also possible to rotate a polarization plane of the incident light depending on the intensity of the electric field by using an electro-optical medium having Pockels effect or the like without having electrodes for making an analyzer having polarizing performance pass through the polarization plane and obtaining the intensity modulation signal. As for the magnetic field, it is also possible to rotate the polarization plane of the incident light depending on the intensity of the magnetic field by using a magnetic optical medium having Faraday effect or the like for making the polarizer or the like pass through the polarization plane and obtaining the optical intensity modulation signal. As for the input optical fiber for transferring the incident light to the optical sensor unit, a single mode optical fiber, a polarized storage optical fiber and the like can be used depending on the necessity of the optical sensor unit. As for the output optical fiber, the single mode optical fiber can be used when the intensity and the phase of the incident light are modulated, while the polarized storage optical fiber can be used when the direction of the polarization plane is modulated.

In addition, the light sensor probe of the present invention is provided with a package for protecting the optical sensor unit and facilitating the handling. The optical sensor unit and a part of the input optical fiber and the output optical fiber attached to the optical sensor unit are housed in the package. The package includes the shielding layer at least in a part of the package. The shielding layer is formed of a material having a shielding effect for shielding the electric field when the electric field is measured. The shielding layer is formed of a material having a shielding effect for shielding the magnetic field when the magnetic field is measured. Furthermore, the shielding layer has an opening at a position capable of facing the measurement place so that the opening can be approached to the measurement place. The electric field of the magnetic field to be measured is transferred to the optical sensor unit only thorough the opening. Since a size of the area of the opening affects the sensitivity of the light sensor probe, it is possible to select the shape and the size of the opening depending on the shape and the sensitivity of the portion of the object to be measured. It is also possible to replace a plurality of bodies having different opening shapes with each other. In addition, as for the range of the shielding layer provided on the package, it is enough if the shielding layer is provided on the range capable of at least preventing the electric field or the magnetic field from arriving at the optical sensor unit from the other portions than the portion of the object to be measured.

The voltage signal propagated through the wiring and the terminal of a specific part of the electric circuit can be detected by arranging the opening of the shielding layer close to the specific part so that the electric field generated by the wiring or the like around it and the magnetic field generated by the current signal pass through the opening of the shielding layer to detect the component reaching the optical sensor unit. Similarly, the electromagnetic wave noise generated from the specific part can be detected by arranging the opening close to the specific part. As described above, since the opening of the shielding layer is provided, the electric field and the magnetic field reached from the other portions than the opening to the optical sensor unit can be shielded. Thus, the detection of the electric field, the magnetic field and the electromagnetic wave noise generated by the electric signal of the wiring or the like of the portions other than the target measurement place is eliminated and the information of the target measurement place can be obtained.

In the present invention, the material of the shielding layer for obtaining the shielding effect of the electric field is typically a metal. However, the shielding layer can be formed by conductive materials such as a carbon or formed by an electric wave absorber without being limited to the metal. The electric wave absorber such as a ferrite can be used as the shielding layer for obtaining the shielding effect of the magnetic field. Furthermore, the shielding layer can be a layered structure of the metal and the electric wave absorber. It is also possible to interpose an insulating layer between the metal and the electric wave absorber. The shape of the package can be an arbitrary shape as long as the optical sensor unit and mounting parts of the input optical fiber and the output optical fiber mounted on the optical sensor unit are housed inside the package and covered by the package. The shielding layer can be formed on an outermost surface of the package while the shielding layer can be formed in an inner surface of the package or formed as an intermediate layer of the material forming the package.

In the second viewpoint of the present invention, the light sensor probe of the first viewpoint is characterized in that the package includes an insulating layer at least in the opening and an outermost surface of a circumference of the opening. The light sensor probe of the present invention has a purpose of measuring the signal and detecting the electromagnetic noise in the high voltage circuits as described above. The insulating layer is provided on the opening and the surface of the outermost surface of the circumference of the opening since these portions may be erroneously touched by the wiring or the like to be measured. Thus, it is possible to prevent the conductive material such as the metal forming the package from contacting the wiring or the like to be measured. Accordingly, the influence to the normal operation of the circuit can be eliminated. When the absorption of the electromagnetic waves absorbed by the insulating layer is small, it is possible to cover the opening by the insulating layer.

In the third viewpoint of the present invention, the light sensor probe of the first or second viewpoint is characterized in that the optical sensor unit includes: an antenna configured to generate a voltage depending on the intensity of the electric field of a place on which the antenna is located; and an optical modulator having a modulation electrode which is connected with the antenna or integrally formed with the antenna, and the optical sensor unit is configured to modulate the intensity of the incident light depending on the voltage applied to the modulation electrode and output the modulated light. Although a phase modulator can be used for the optical modulator of the present invention, the conversion from the optical signal to the electric signal is easier and the configuration is simpler when an intensity modulator is used. As the configurations of the antenna and the modulation electrode, a small antenna can be housed inside the package and connected with the modulation electrode while being separated from the optical modulator. Alternatively, the antenna pad having the same configuration as the modulation electrode can be prepared while being integrated with the modulation electrode. Alternatively, it is also possible to impart the function of the antenna to the modulation electrode. Namely, the modulation electrode can be formed to generate the voltage at a predetermined portion by the electric field.

In the fourth viewpoint of the present invention, the light sensor probe of the third viewpoint is characterized in that the optical modulator is a branch interference type optical modulator using an optical waveguide formed on a lithium niobate crystal substrate. In this viewpoint of the invention, the conventionally used branch interference type optical modulator using the optical waveguide formed on the lithium niobate crystal is used as the optical modulator. The branch interference type optical modulator is basically composed of: an input optical waveguide extended from a light incident side, two phase shift waveguides extended from the input optical waveguide while being branched into two; an output optical waveguide located at a junction of the two phase shift optical waveguides and connected to a light emission side; and a modulation electrode arranged in parallel with the phase shift waveguides. The voltage signal is applied to the phase shift waveguides via the modulation electrodes, a refractive index of the phase shift optical waveguides is changed, and the light passing through the two phase shift optical waveguides are joined and interfered with each other. Thus, the optical intensity is modulated. The branch interference type optical modulator is suitable for the light sensor probe of the present invention since a small, highly efficient and broadband optical modulator can be obtained.

In the fifth viewpoint of the present invention, the light sensor probe of the fourth viewpoint is characterized in that the optical modulator is a reflection type optical modulator where the incident light is reflected inside the optical modulator to change a direction of the incident light, and the input optical fiber and the output optical fiber are formed by one input/output optical fiber. The reflection type optical modulator of this viewpoint of the invention uses the configuration of reflecting the incident light in the phase shift waveguides and returning the reflected light to the optical waveguide of the incident side. When the above described configuration of the reflection type optical modulator is used, the length of passing the light is twice as long as a transmission-type optical modulator having the same electrode length. Thus, the optical modulator can be streamlined, broad-banded and downsized. Furthermore, since the number of the optical fiber connected to the optical modulator is one, handling is facilitated.

In the sixth viewpoint of the present invention, the light sensor probe of the first or second viewpoint is characterized in that the optical sensor unit includes an optical modulation medium configured to rotate a polarization plane of the incident light depending on the intensity of the magnetic field of the place on which the optical sensor unit is located, and the optical sensor unit is configured to modulate at least one of the intensity of the incident light, a phase of the incident light and the polarization plane of the incident light depending on the intensity change of the magnetic field and output the modulated light through the output optical fiber. In the optical sensor unit of this viewpoint of the invention, the incident light is passed through the medium having magneto-optical effect such as Faraday effect. Thus, the polarization plane is rotated depending on the intensity of the magnetic field. The input optical fiber and the output optical fiber can be formed by the polarized storage optical fiber to modulate the rotation angle of the polarization plane and output the light. Alternatively, the polarizer or the like can be used to output only a predetermined polarization component and obtain a light intensity modulated light and output it through the single mode optical fiber. The incident light can be converted into a parallel light by the lens and the parallel light can be passed through a bulky optical modulation medium. Alternatively, the pass of the light can be formed by the optical waveguide to modulate the light in the optical waveguide. Since the surrounding magnetic field is changed by the current flowing in the electric circuit, a current waveform can be measured by detecting the change of the magnetic field using this viewpoint of the invention.

In the seventh viewpoint of the present invention, the light sensor probe of the sixth viewpoint is characterized in that the optical sensor unit includes a polarization element configured to allow a passage of only a predetermined polarization component, and the optical sensor unit is configured to modulate the intensity of the incident light depending on the intensity change of the magnetic field and output the modulated light through the output optical fiber.

In the eighth viewpoint of the present invention, the light sensor probe of the first or second viewpoint is characterized in that the package includes an electric wave absorber for reducing a reflection of an electromagnetic wave in the shielding layer. In the present invention, when the shielding layer of the package is made of the material such as a metal having high reflectance of electromagnetic waves, accurate measurement may be prevented by the reflection of the electromagnetic waves and the generation of resonance in the package depending on the frequency to be measured. In this viewpoint of the invention, the radio wave absorbing layer or the like is provided on an inner surface of the package to suppress the reflection of the electromagnetic wave to be measured. Thus, the measurement can be performed more accurately. The electric wave absorber can be anything as long as it has the function of reducing the reflection of the electric wave. For example, a conductive radio wave absorption material formed by textile or the like of conductive fiber which absorbs the electric current generated by the electric wave by the resistance inside the material, a dielectric radio wave absorption material formed by mixing carbon powder or the like with dielectric materials such as rubber, urethane foam and polystyrene foam for using (increasing) an apparent dielectric loss, and a magnetic radio wave absorption material using iron, nickel, ferrite or the like for absorbing the electric wave by magnetic loss. In addition, the shape of the material can be a sheet-shaped material and a coating-type material, for example.

As described above, the present invention can provide the light sensor probe capable of measuring the high voltage signals, identifying the occurrence part of the electromagnetic noise and measuring the waveform of the noise without contact with a measurement place.

BRIEF DESCRIPTION OF DRAWINGS

FIG. 1A is a plan view of a transmission-type and FIG. 1B is a partially enlarged cross-sectional view of a circumference of an opening.

FIG. 3A is a plan view and FIG. 3B is an A-A cross-sectional view.

FIG. 4 is a diagram showing an example of a measurement result of the light sensor probe. FIG. 4 shows a frequency property.

FIG. 5 shows a voltage amplitude property.

FIG. 6A is a plan view of a transmission-type light sensor probe and FIG. 6B is an A-A cross-sectional view of the optical modulator.

DETAILED DESCRIPTION OF THE INVENTION

Figure 1:
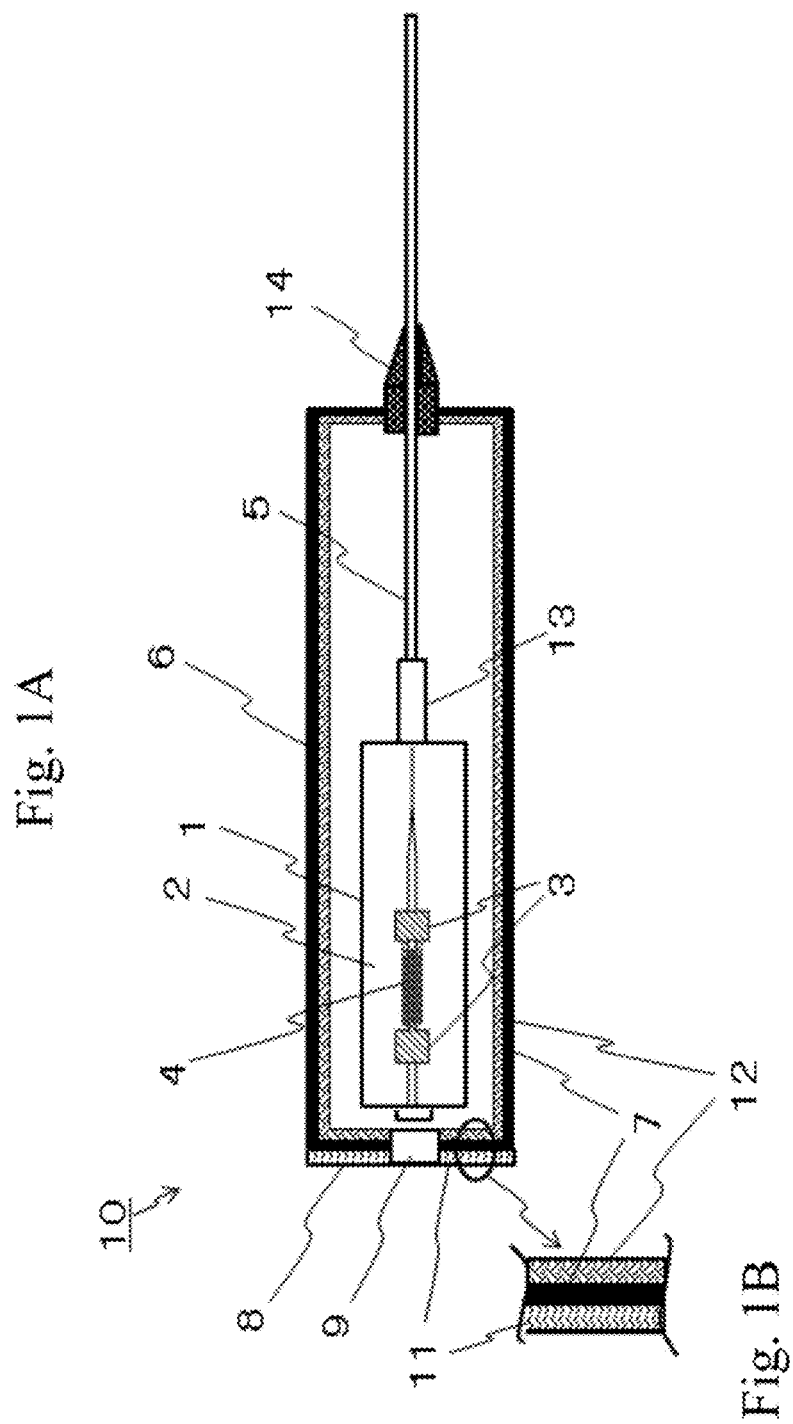
FIGS. 1A and 1B are diagrams schematically showing a configuration of a light sensor probe concerning the first embodiment.

Hereafter, the light sensor probe of the present invention will be explained in detail using the embodiments with reference to the drawings. Note that the same reference numerals are added to the same elements in the explanation of the drawings and the repeated explanation will be omitted

First Embodiment

FIGS. 1A and 1B are diagrams schematically showing a configuration of a light sensor probe concerning the first embodiment. FIG. 1A is a plan view of a transmission-type and FIG. 1B is a partially enlarged cross-sectional view of a circumference of an opening.

A light sensor probe 10 shown in FIGS. 1A and 1B includes an optical sensor unit 1 configured to modulate the incident light depending on the intensity of the electric field of the place on which the light optical sensor unit 1 (sensor probe 10) is located and output the modulated light, an input optical fiber connected with the optical sensor unit 1 and an output optical fiber connected with the optical sensor unit 1. Here, the optical sensor unit 1 includes an optical modulator 2 provided with a modulation electrode 4 formed integrally with antennas 3 configured to generate a voltage depending on the intensity of the electric field of the place on which the antennas 3 are located. The optical sensor unit 1 modulates the intensity of the incident light depending on the voltage applied on the modulation electrode 4 and outputs the modulated light. The optical modulator 2 is a branch interference type optical modulator using the optical waveguide formed on the lithium niobate crystal substrate. Furthermore, the optical modulator 2 is a reflection type optical modulator where the incident light is reflected inside the optical modulator to change a direction of the incident light. The input optical fiber and the output optical fiber are formed by one input/output optical fiber 5.

The light sensor probe 10 includes a package 6 having an approximately rectangular parallelepiped shape so that the optical sensor unit 1 and a part of the input/output optical fiber are housed inside the package 6. The package 6 is formed by a metal plate 7 made of a metal material having the shielding effect to the electric field so that the metal plate 7 functions as the shielding layer. The metal plate 7 has an opening 9 at a position capable of facing the measurement place. Namely, the metal plate 7 has the opening 9 at the tip surface 8 of the rectangular parallelepiped shape. Furthermore, the package 6 includes an insulating layer 11 on an outermost surface of a circumference of the opening 9 of the tip surface 8. In addition, the package 6 includes a radio wave absorbing layer 12 made of a dielectric radio wave absorption material or the like inside the metal plate 7 for preventing the reflection of the electromagnetic waves inside the package 6.

An end portion of the input/output optical fiber 5 is inserted and housed in a ferrule 13 so that an end surface of the input/output optical fiber 5 is adhered and fixed to an input/output end surface of the optical modulator 2. The optical modulator 2 is fixed to a seat or the like fixed to the package 6. The input/output optical fiber 5 is fixed to the package 6 by a rubbery fixing member 14.

Next, the measurement system using the optical voltage prove 10 of the present embodiment will be explained.

Figure 2:
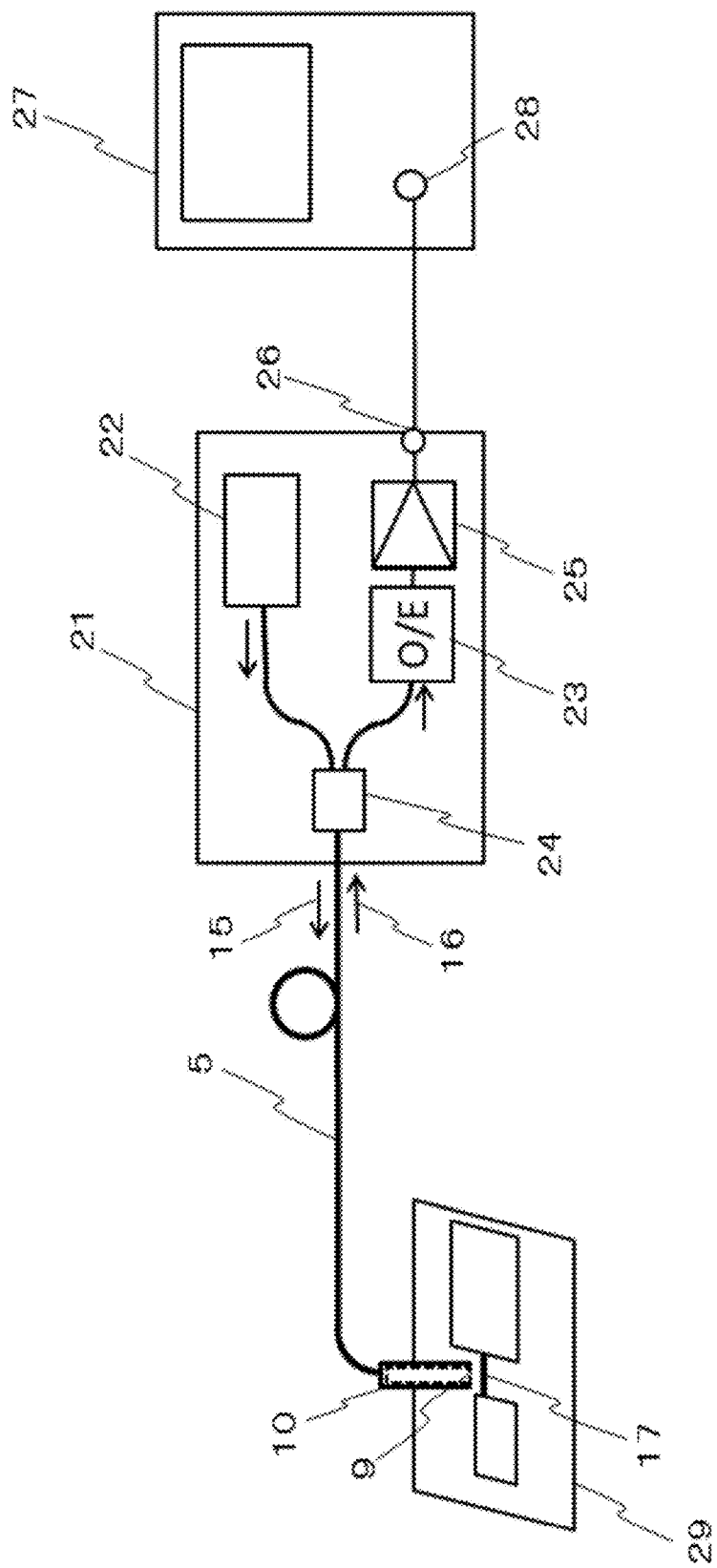
FIG. 2 is a block diagram of a measurement system using the optical voltage prove concerning the first embodiment.

FIG. 2 is a block diagram of the measurement system using the optical voltage prove concerning the first embodiment. As shown in FIG. 2, an incident light 15 is transmitted from an optical transmission/reception unit 21 to the optical voltage prove 10 through the input/output optical fiber 5. An optical intensity modulation signal 16 outputted from the optical modulator 2 is inputted to the optical transmission/reception unit 21 through the same input/output optical fiber 5.

The optical transmission/reception unit 21 includes a light source 22 such as a semiconductor laser, an O/E converter 23, a transmission/reception separator 24 for separating the incident light 15 from the optical intensity modulation signal 16, and an amplifier 25. An emission light emitted from the light source 22 is coupled into the input/output optical fiber 5 through the transmission/reception separator 24. The optical intensity modulation signal 16 returned from the input/output optical fiber 5 is inputted to the O/E converter 23 through the transmission/reception separator 24. The optical intensity modulation signal 16 is converted into the electric signal in the O/E converter 23, and the electric signal is amplified by the amplifier 25 and output to an output terminal 26. The outputted electric signal is inputted to an input terminal 28 of a measuring instrument 27 such as an oscilloscope. The transmission/reception separator 24 can be formed by one of an optical circulator, an optical fiber splitter and a semi-transparent mirror.

FIG. 2 shows the case of measuring the voltage signal applied on a wiring 17 located between two electric components incorporated in an electric circuit board 29 as the measurement place. The electromagnetic-wave signal generated by the change of the electric field is generated around the wiring 17 by the voltage signal propagated through the wiring 17 and the electromagnetic-wave signal enters in the package 6 from the opening 9 located at the tip end of the light sensor probe 10. As shown in FIG. 1, the electromagnetic-wave signal is detected by the antennas 3 of the optical sensor unit 1 and applied on the modulation electrode 4 as the voltage signal. Thus, the incident light 15 is converted into the optical intensity modulation signal 16.

As described above, the voltage signal propagated through the wiring 17 is converted into the optical intensity modulation signal 16. The optical intensity modulation signal 16 is converted into the electric signal in the optical transmission/reception unit 21. The voltage waveform and the like are observed by the measuring instrument 27 and the waveform of the voltage signal propagated through the wiring 17 can be grasped.

Figure 3A:
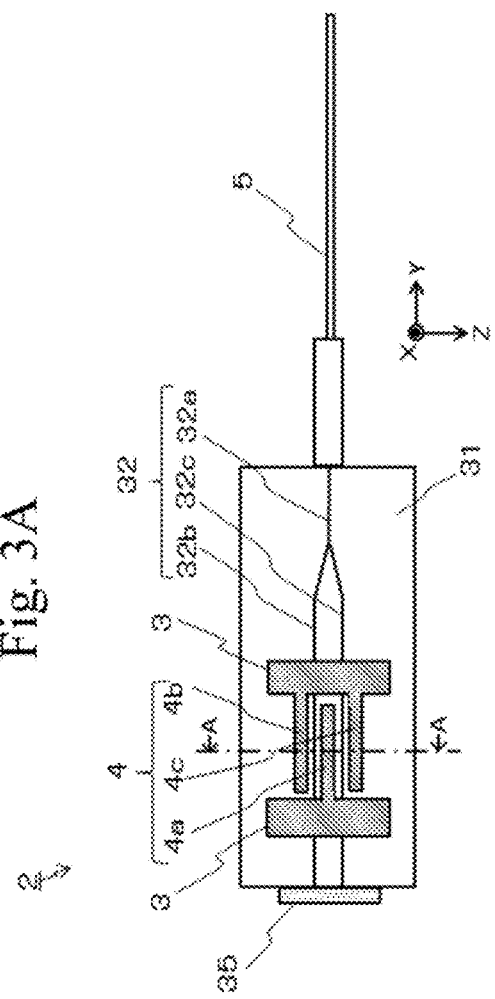
FIGS. 3A and 3B are diagrams schematically showing an example of the configuration of a reflection type optical modulator provided with the optical sensor unit included in the light sensor probe.
Figure 3B:
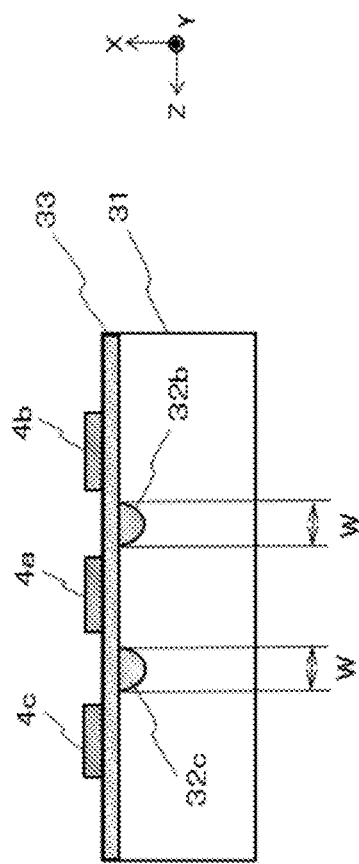

FIGS. 3A and 3B are diagrams schematically showing an example of the configuration of a reflection type optical modulator 2 provided with the optical sensor unit 1 included in the light sensor probe 10. FIG. 3A is a plan view and FIG. 3B is an A-A cross-sectional view.

In FIGS. 3A and 3B, the optical modulator 2 is composed of: a substrate 31 formed by cutting (X cutting) a lithium niobate ($LiNbO_3$) crystal which is a crystal having an electrooptic effect; a branch interference type optical waveguide 32 formed on an upper surface side of the substrate 31 by Ti diffusion; a buffer layer 33 coated on an upper surface side of the substrate 31; a modulation electrode 4 formed on the buffer layer 33; an antennas 3 formed integrally with the modulation electrode 4; and a light reflecting portion 35 installed on one end portion of the substrate 31. The modulation electrode 4 and the antennas 3 are two-layered film of chrome (Cr) and *aurum* (Au) formed by sputtering or the like.

The branch interference type optical waveguide 32 is composed of: an input/output optical waveguide 32a extending toward the direction from which the input (incident) light is inputted; and two phase shift optical waveguides 32b, 32c extended from the input/output optical waveguide 32a and branched into two. In the input/output optical waveguide 32a and the phase shift optical waveguides 32b, 32c, the widths W, which are vertical to the direction of extending the waveguides 32a, 32b and 32c, are equal to each other. In addition, the lengths of the phase shift optical waveguides 32b, 32c in the extending direction are approximately equal to each other.

The widths W of the optical waveguides are within the range of 5 to 12 μm. The lengths of the phase shift optical waveguides 32b, 32c in the extending direction are within the range of 10 to 30 mm. The phase shift optical waveguides 32b, 32c are separated from each other and extended in parallel to each other so that the center parts of them are separated by a predetermined distance in the width direction. The distance between the phase shift optical waveguides 32b, 32c at the center part is within the range of 15 to 50 μm. Note that the widths W of the input/output optical waveguide 32a and the phase shift optical waveguides 32b, 32c, the lengths of the phase shift optical waveguides 32b, 32c, and the distance between the phase shift optical waveguides 32b, 32c are not particularly limited and can be arbitrarily specified.

The buffer layer 33 is provided for the purpose of preventing a part of the light propagating through the branch interference type optical waveguide 32 from being absorbed by the modulation electrode 4 and the antennas 3. The buffer layer 33 is mainly made of silica ($SiO_2$) film or the like and the thickness of the buffer layer 33 is approximately 0.1 to 1.0 μm.

In the optical modulator 2, the modulation electrode 4 includes: an electrode portion 4a arranged between the phase shift optical waveguides 32b, 32c and connected with the left antenna 3; and electrode portions 4b, 4c arranged on both sides of the electrode portion 4a sandwiching the phase shift optical waveguides 32b, 32c and connected with the right antenna 3. The input/output terminal of the input/output optical fiber 5 is coupled with the light input/output end of the input/output optical waveguide 32a of the substrate 31. The light reflecting portion 35 reflects the light incident from the input/output optical waveguide 32a and propagated through the phase shift optical waveguides 32b, 32c to return the light and make the light propagate from the phase shift optical waveguides 32b, 32c to the input/output optical waveguide 32a. In accordance with the voltage induced by the antennas 3, an electric field is applied to the two phase shift optical waveguides 32b, 32c (i.e., between the electrode portions 4a, 4b and between the phase shift optical waveguides 32b, 32c) in an opposite direction to each other. Consequently, the refractive index change occurs in the phase shift optical waveguides 32b, 32c in an opposite direction to each other. Thus, a phase shift having polarity opposite to each other is made in the light passing through the phase shift optical waveguides 32b, 32c. The intensity change occurs when the lights are joined since the lights are interfered with each other. As a result, the optical intensity modulation signal having the light intensity change depending on the voltage applied on the modulation electrode 4 via the antennas 3 can be obtained.

Figure 5:
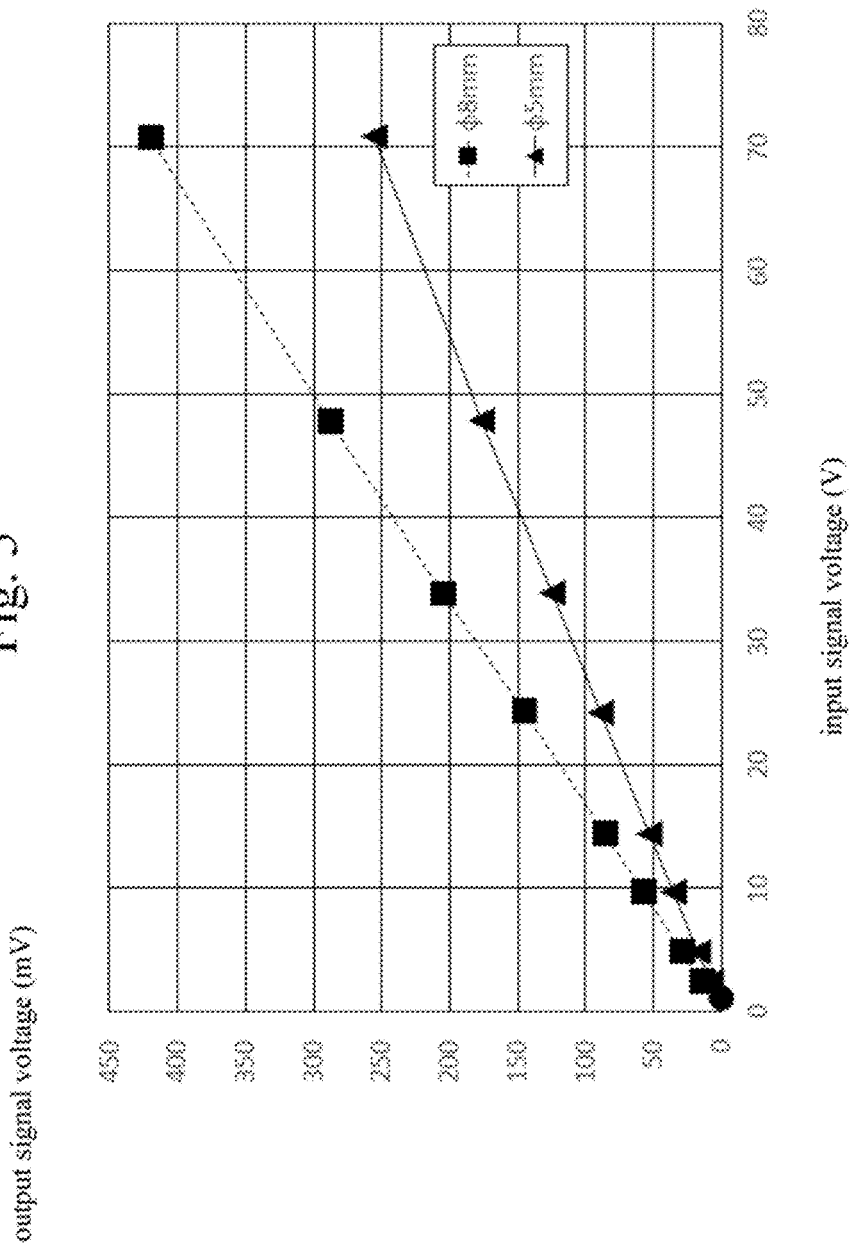
FIG. 5 is a diagram showing an example of a measurement result of the light sensor probe.

FIG. 4 and FIG. 5 are diagrams showing an example of the measurement result of the light sensor probe. FIG. 4 shows the measurement result of a frequency property and FIG. 5 shows the measurement result of a voltage amplitude property. The opening 9 of the light sensor probe 10 was approached to the electric wiring through which the voltage signal pass with a clearance of approximately 2 to 3 mm. Here, the shape of the opening 9 was a circular shape and the measurement was performed for the size (diameter) φ of the openings 9 of 5 mm and for the size (diameter) φ of the openings 9 of 8 mm. In FIG. 4, in both cases (both sizes of the opening), the obtained frequency property was almost same as the frequency property of the conventional optical magnetic field sensor probe which does not use the package of the present embodiment. In FIG. 5, in both cases (both sizes of the opening), linear characteristics could be obtained about the voltage amplitude.

Second Embodiment

Figure 6A:
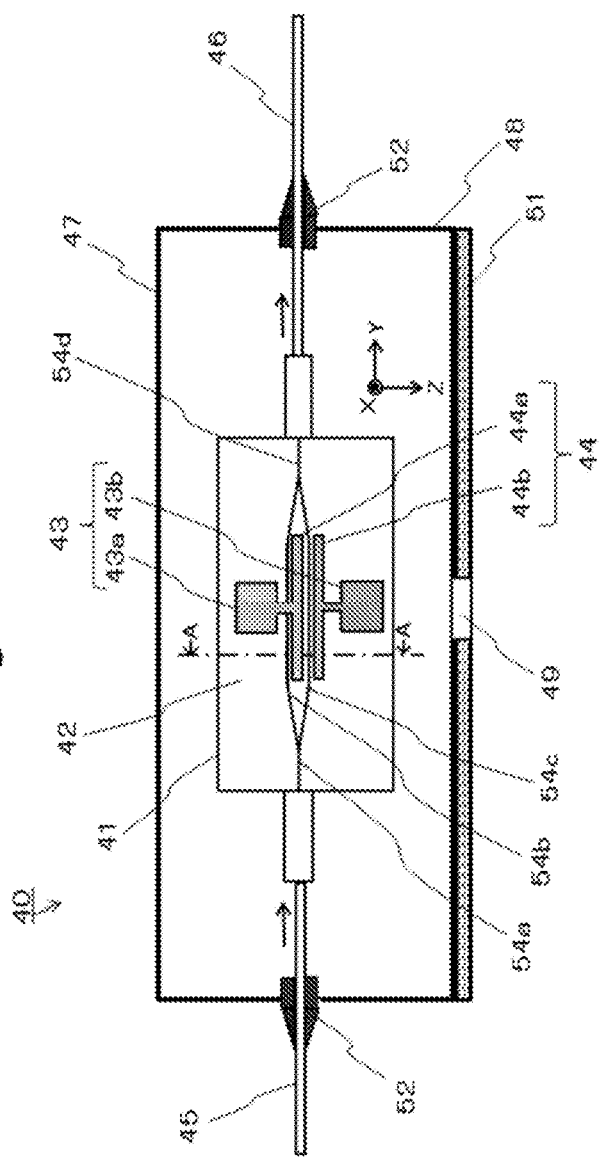
FIGS. 6A and 6B are diagrams schematically showing a configuration of the light sensor probe concerning the second embodiment.
Figure 6B:
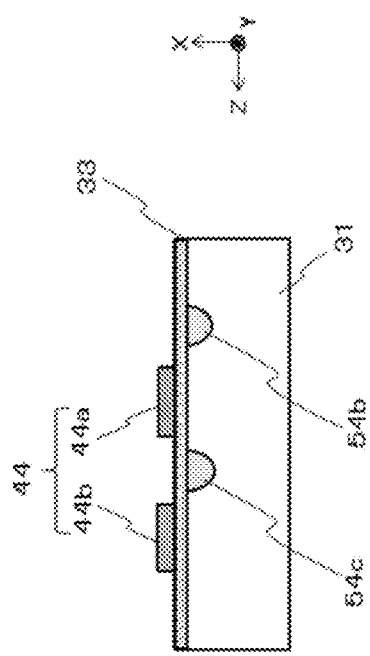

FIGS. 6A and 6B are diagrams schematically showing the configuration of the light sensor probe concerning the second embodiment. FIG. 6A is a plan view of a transmission-type light sensor probe and FIG. 6B is an A-A cross-sectional view of the optical modulator.

In FIGS. 6A and 6B, a light sensor probe 40 of the present embodiment includes: an optical sensor unit 41 configured to modulate the incident light depending on the intensity of the electric field of the place on which the optical sensor unit 41 (light sensor probe 40) is located and output the modulated light; an input optical fiber 45 connected with the optical sensor unit 41; and an output optical fiber 46 connected with the optical sensor unit 41. Here, the optical sensor unit 41 includes: antennas 43 configured to generate a voltage depending on the intensity of the electric field of the place on which the antennas 43 are located; and an optical modulator 42 having a modulation electrode 44 connected with the antennas 43. The optical sensor unit 41 modulates the intensity of the incident light depending on the voltage applied on the modulation electrode 44 and outputs the modulated light. The optical modulator 42 is a branch interference type optical modulator using the optical waveguide formed on the lithium niobate crystal substrate.

The light sensor probe 40 includes a package 47 having an approximately rectangular parallelepiped shape so that the optical sensor unit 41, a part of the input optical fiber 45 and a part of the output optical fiber 46 are housed inside the package 47. The package 47 is formed by a metal plate 48 having a shielding effect to the electric field. The metal plate 48 has an opening 49 at a position capable of facing the measurement place. Namely, the metal plate 48 has the opening 49 at the side surface of the rectangular parallelepiped shape near the antennas 43. Furthermore, an insulating layer 51 is provided on the outermost surface of the circumference of the opening 49.

The end portions of the input optical fiber 45 and the output optical fiber 46 are inserted into the ferrule and fixed to the ferrule so that the end portions are adhered and fixed to the light input/output ends of the optical modulator 42. The optical modulator 42 is fixed to a seat or the like fixed to the package 47. The input optical fiber 45 and the output optical fiber 46 are fixed to the package 47 by a rubbery fixing member 52.

In FIGS. 6A and 6B, the optical modulator 42 is provided with the branch interference type optical waveguide manufactured by the same process as the optical modulator 2 of the first embodiment. The branch interference type optical waveguide is formed on the substrate 31 formed by cutting (X cutting) the lithium niobate crystal which is a crystal having an electrooptic effect. However, the optical modulator 42 of the present embodiment is not the reflection type but a transmission-type optical modulator. The branch interference type optical waveguide is composed of: an input optical waveguide 54a extending toward the direction from which the input (incident) light is inputted; two phase shift optical waveguides 54b, 54c extended from the input optical waveguide 54a and branched into two; and an output optical waveguide 54d at which the two phase shift optical waveguides 54b, 54c are joined.

In the optical modulator 42, the modulation electrode 44 includes: an electrode portion 44a arranged between the phase shift optical waveguides 54b, 54c and connected with the upper antenna 43a; and an electrode portion 44b arranged facing the electrode portion 44a sandwiching the phase shift optical waveguide 54c and connected with the lower antenna 43b. In accordance with the voltage induced by the antennas 43, an electric field is applied between the electrode portions 44a, 44b. The refractive index change occurs in the phase shift optical waveguide 54c. Thus, a phase shift is made in the light passing through the phase shift optical waveguides 54b, 54c. The intensity change occurs when the lights are joined since the lights are interfered with each other. As a result, the optical intensity modulation signal having the light intensity change depending on the voltage applied on the modulation electrode 44 via the antennas 43 can be obtained.

Next, the measurement system using the light sensor probe 40 of the present embodiment will be explained.

Figure 7:
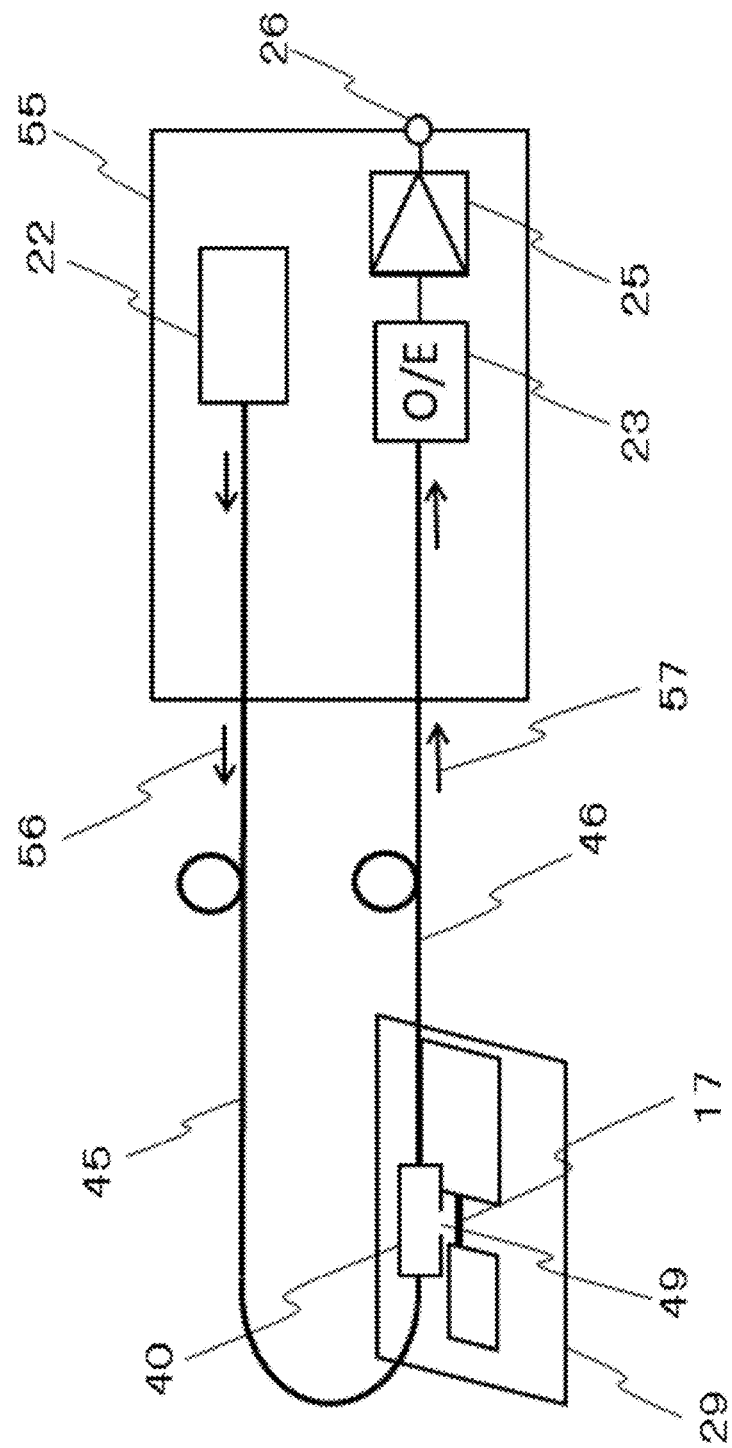
FIG. 7 is a block diagram of a measurement system using the light sensor probe concerning the second embodiment.

FIG. 7 is a block diagram of the measurement system using the light sensor probe of the second embodiment. As shown in FIG. 7, an incident light 56 is transmitted from an optical transmission/reception unit 55 to the light sensor probe 40 through the input optical fiber 45. An optical intensity modulation signal 57 outputted from the light sensor probe 40 is inputted to the optical transmission/reception unit 55 through the output optical fiber 46. The optical transmission/reception unit 55 includes a light source 22 such as a semiconductor laser, an O/E converter 23 and an amplifier 25. An emission light emitted from the light source 22 is coupled into the input optical fiber 45. The optical intensity modulation signal 57 returned from the output optical fiber 46 is inputted to the O/E converter 23. The optical intensity modulation signal 57 is converted into the electric signal in the O/E converter 23, and the electric signal is amplified by the amplifier 25 and output to an output terminal 26. The outputted electric signal is inputted to an input terminal of the measuring instrument such as an oscilloscope.

The electromagnetic-wave signal is generated around the wiring 17 between two electric components installed on the electric circuit board 29 by the change of the electric field caused by the voltage signal propagated through the wiring 17. The electromagnetic-wave signal enters in the package 47 from the opening 49 of the light sensor probe 40. The electromagnetic-wave signal is detected by the antennas 43 of the optical sensor unit 41 as the voltage signal and applied on the modulation electrode 44. Thus, the incident light 56 is converted into the optical intensity modulation signal 57.

Third Embodiment

Figure 8:
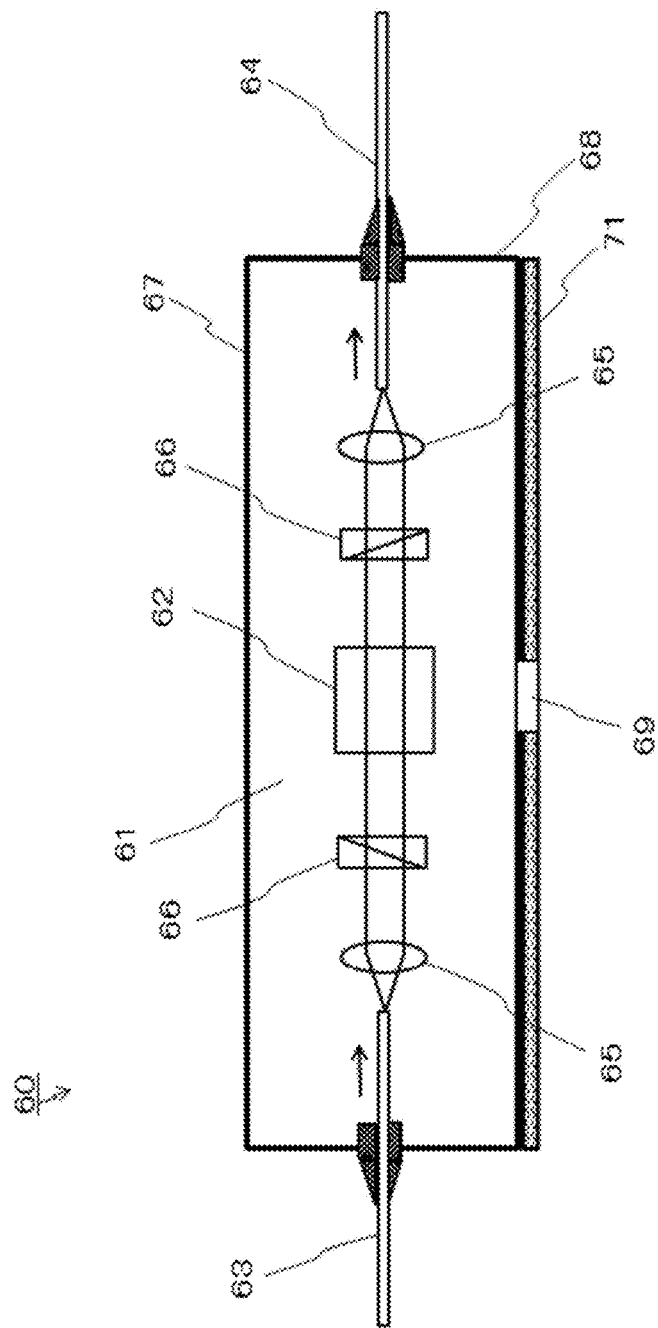
FIG. 8 is a configuration diagram schematically showing the light sensor probe concerning the third embodiment.

FIG. 8 is a configuration diagram schematically showing the light sensor probe concerning the third embodiment. In FIG. 8, an optical sensor unit 61 of a light sensor probe 60 of the present embodiment includes an optical modulation medium 62 configured to rotate the polarization plane of the incident light depending on the intensity of the magnetic field of the place on which the optical modulation medium 62 is located. As for the optical modulation medium 62, the materials having Faraday effect and allows a passage of a predetermined wavelength can be used. For example, garnet crystals and III-V semiconductor materials can be used. An emission light emitted from an input optical fiber 63 is converted into a parallel light by a lens 65 and passed through a polarization element 66 which allows a passage of only a predetermined polarization component. Then, the emission light enters in the optical modulation medium 62. The polarization plane of the incident light passes through the optical modulation medium 62 and rotated depending on the intensity of the magnetic field of the place on which the optical modulation medium 62 is placed. Thus, the incident light passes through the polarization element 66 arranged on the light emission side and converted into a light intensity modulated light. The light intensity modulated light is condensed by the lens 65 of the light emission side and inputted to an output optical fiber 64.

Also in the present embodiment, the light sensor probe 60 includes a package 67 having an approximately rectangular parallelepiped shape so that the optical sensor unit 61, a part of the input optical fiber 63 and a part of the output optical fiber 64 are housed inside the package 67. The package 67 is formed by a ferrite plate 68 having a shielding effect to the magnetic field. The ferrite plate 68 has an opening 49 at a position capable of facing the measurement place. Namely, the ferrite plate 68 has the opening 49 at the side surface of the rectangular parallelepiped shape near the optical modulation medium 62. Furthermore, an insulating layer 71 is provided on the outermost surface of the circumference of the opening 69.

The measurement system of the present embodiment using the light sensor probe 60 can be formed similar to the measurement system of the second embodiment. Since the magnetic field around the wiring is changed by the current flowing through the circuit board, the magnetic field signal induced by the current signals detected through the opening 69 is converted into the optical intensity modulation signal. Finally, the optical intensity modulation signal is measured as the electric signal by an oscilloscope or the like.

As described above, the present invention enables to measure the signals and the current waveform of high voltage signals and the waveform of the electromagnetic noise without contact with a measurement place. Furthermore, when the opening is scanned to identify the part where the signal intensity is strong, the occurrence part of the electromagnetic noise can be detected.

It goes without saying that the present invention is not limited to the above described embodiments and the present invention can be variously modified in accordance with various purposes. For example, the modification can be arbitrarily performed depending on the type of the optical modulator to be used, the existence of the divided electrode used on the modulation electrode, the frequency and amplitude of the voltage to be measured, for example. In addition, the material of the shielding layer and the insulating layer of the package can be selected in accordance with the target shielding property of the electromagnetic-wave, for example. The shape and the structure of the package can be arbitrarily selected. For example, in addition to the rectangular parallelepiped shape of the above described embodiments, a cylindrical shape can be used. A polarized storage optical fiber can be used for the input optical fiber or the input/output optical fiber of the present invention.

DESCRIPTION OF THE REFERENCE NUMERALS 1, 41, 61: optical sensor unit; 2, 42: optical modulator; 3, 43, 43a, 43b: antenna; 4, 44: modulation electrode; 4a, 4b, 4c, 44a, 44b: electrode portion; 5: input/output optical fiber; 6, 47, 67: package; 7, 48: metal plate; 8: tip surface; 9, 49, 69: opening; 10, 40, 60: light sensor probe; 11, 51, 71: insulating layer; 12: radio wave absorbing layer; 13: ferrule; 14, 52: fixing member; 15, 56: incident light; 16, 57: optical intensity modulation signal; 17: wirings; 21, 55: optical transmission/reception unit; 22: light source; 23: O/E converter; 24: transmission/reception separator; 25: amplifier; 26: output terminal; 27: measuring instrument; 28: input terminal; 29: electric circuit board; 31: substrate; 32: branch interference type optical waveguide; 32a: input/output optical waveguide; 32b, 32c, 54b, 54c: phase shift optical waveguide; 33: buffer layer; 35: light reflecting portion; 45, 63: input optical fiber; 36, 64: output optical fiber; 62: optical modulation medium; 65: lens; 66: polarization element

The invention claimed is:

1. A light sensor probe, comprising:
an optical sensor unit configured to modulate an incident light depending on an intensity of an electric field or a magnetic field of a place on which the optical sensor unit is located and output the modulated light;
an input optical fiber that is connected with the optical sensor unit;
an output optical fiber that is connected with the optical sensor unit; and
a package that houses the optical sensor unit, a part of the input optical fiber and a part of the output optical fiber inside the package, wherein
an intensity change of the electric field or the magnetic field generated at a measurement place is converted into an optical signal by the optical sensor unit and the optical signal is outputted through the output optical fiber,
the package has a shielding layer formed of a material having a shielding effect for shielding the electric field or the magnetic field at least in a part of the package for preventing the electric field or the magnetic field from arriving at the optical sensor unit from the other portions than the measurement place,
the package is formed of a metal, a conductive material or an electric absorber, and
the shielding layer has an opening at a position capable of facing the measurement place so that the opening can be approached to the measurement place.

2. The light sensor probe according to claim 1, wherein the package includes an insulating layer at least in the opening and an outermost surface of a circumference of the opening.

3. The light sensor probe according to claim 1, wherein the optical sensor unit includes:
an antenna configured to generate a voltage depending on the intensity of the electric field of a place on which the antenna is located; and
an optical modulator having a modulation electrode which is connected with the antenna or integrally formed with the antenna, and
the optical sensor unit is configured to modulate the intensity of the incident light depending on the voltage applied to the modulation electrode and output the modulated light.

4. The light sensor probe according to claim 3, wherein the optical modulator is a branch interference type optical modulator using an optical waveguide formed on a lithium niobate crystal substrate.

5. The light sensor probe according to claim 4, wherein the optical modulator is a reflection type optical modulator where the incident light is reflected inside the optical modulator to change a direction of the incident light, and
the input optical fiber and the output optical fiber are formed by one input/output optical fiber.

6. The light sensor probe according to claim 1, wherein the optical sensor unit includes an optical modulation medium configured to rotate a polarization plane of the incident light depending on the intensity of the magnetic field of the place on which the optical sensor unit is located, and
the optical sensor unit is configured to modulate at least one of the intensity of the incident light, a phase of the incident light and the polarization plane of the incident light depending on the intensity change of the electric field and output the modulated light through the output optical fiber.

7. The light sensor probe according to claim 6, wherein the optical sensor unit includes a polarization element configured to allow a passage of only a predetermined polarization component, and
the optical sensor unit is configured to modulate the intensity of the incident light depending on the intensity change of the magnetic field and output the modulated light through the output optical fiber.

8. The light sensor probe according to claim 1, wherein the package includes an electric wave absorber for reducing a reflection of an electromagnetic wave in the shielding layer.

* * * * *